United States Patent
Eiland et al.

(10) Patent No.: US 12,120,840 B2
(45) Date of Patent: Oct. 15, 2024

(54) DIRECT-MOUNT ACOUSTICS DAMPING SHELF AT BACKPLANE-IDENTIFIED DEVICES

(71) Applicant: Dell Products L.P., Round Rock, TX (US)

(72) Inventors: Richard Eiland, Austin, TX (US); Chris Peterson, Austin, TX (US); Eduardo Escamilla, Round Rock, TX (US); Paul Waters, Austin, TX (US); Chien-Hung Chou, Sijhih (TW); Juan Torres-Gonzalez, Austin, TX (US); Jyh-Yinn Lin, Taipei (TW); Hung-Pin Chien, Taipei (TW)

(73) Assignee: Dell Products L.P., Round Rock, TX (US)

( * ) Notice: Subject to any disclaimer, the term of this patent is extended or adjusted under 35 U.S.C. 154(b) by 421 days.

(21) Appl. No.: 17/220,654

(22) Filed: Apr. 1, 2021

(65) Prior Publication Data

US 2022/0322560 A1  Oct. 6, 2022

(51) Int. Cl.
| | | |
|---|---|---|
| *G06F 1/16* | (2006.01) | |
| *G10K 11/162* | (2006.01) | |
| *H05K 5/00* | (2006.01) | |
| *H05K 7/00* | (2006.01) | |
| *H05K 7/14* | (2006.01) | |
| *H05K 7/20* | (2006.01) | |

(52) U.S. Cl.
CPC ......... *H05K 7/1489* (2013.01); *G10K 11/162* (2013.01); *H05K 7/1438* (2013.01); *H05K 7/20736* (2013.01)

(58) Field of Classification Search
CPC ............ H05K 7/1489; H05K 7/20736; H05K 7/1491; H05K 7/1492; H05K 7/1494; H05K 7/1495; H05K 7/1488; H05K 7/1438–1459
See application file for complete search history.

(56) References Cited

U.S. PATENT DOCUMENTS

| | | | | | |
|---|---|---|---|---|---|
| 4,235,303 | A * | 11/1980 | Dhoore | ................... | B64D 33/02 428/6 |
| 4,782,913 | A * | 11/1988 | Hoffmann | ........... | B60R 13/0838 181/291 |
| 4,787,473 | A * | 11/1988 | Fuchs | .................... | F16L 55/033 181/290 |
| 5,199,846 | A * | 4/1993 | Fukasaku | ............... | F04D 29/664 415/206 |
| 5,646,369 | A * | 7/1997 | Miska | .................. | H05K 9/0015 174/363 |
| 6,104,608 | A * | 8/2000 | Casinelli | ................. | F24F 13/24 181/224 |
| 7,314,113 | B2 * | 1/2008 | Doll | ........................ | E04F 17/04 415/208.4 |

(Continued)

*Primary Examiner* — Anthony M Haughton
(74) *Attorney, Agent, or Firm* — Jackson Walker L.L.P.

(57) ABSTRACT

An information handling system may include a backplane configured to couple at a first side thereof to a plurality of physical storage resources, an air mover configured to provide cooling to the information handling system, and a shelf coupled to the backplane at a second, opposite side thereof, wherein the shelf is disposed between the first side of the backplane and the air mover. The shelf may include an acoustically absorbent material.

9 Claims, 7 Drawing Sheets

(56) References Cited

U.S. PATENT DOCUMENTS

| | | | | |
|---|---|---|---|---|
| 7,549,505 | B1* | 6/2009 | Kawar | G06F 1/18 |
| | | | | 181/210 |
| 10,565,974 | B1* | 2/2020 | Bhatia | G11B 33/08 |
| 10,568,238 | B1* | 2/2020 | Leung | H05K 7/20736 |
| 11,388,837 | B2* | 7/2022 | Waters | G10K 11/16 |
| 11,756,521 | B2* | 9/2023 | Hakuta | G10K 11/162 |
| | | | | 181/198 |
| 2012/0243170 | A1* | 9/2012 | Frink | G06F 13/4068 |
| | | | | 361/679.33 |
| 2014/0307375 | A1* | 10/2014 | Mann | H05K 7/1457 |
| | | | | 361/728 |
| 2017/0092335 | A1* | 3/2017 | Schroeder | G11B 33/08 |
| 2017/0094828 | A1* | 3/2017 | Van Pelt | H05K 7/1489 |
| 2018/0197523 | A1* | 7/2018 | Chen | G10K 11/161 |
| 2018/0330712 | A1* | 11/2018 | Chen | F16L 55/0331 |
| 2019/0016398 | A1* | 1/2019 | Hartman | H05K 7/1487 |
| 2019/0159361 | A1* | 5/2019 | Chen | G10K 11/162 |
| 2020/0383228 | A1* | 12/2020 | Lu | G11B 33/128 |
| 2021/0127522 | A1* | 4/2021 | Wang | H05K 7/1487 |

\* cited by examiner

DIRECT-MOUNT ACOUSTICS DAMPING SHELF AT BACKPLANE-IDENTIFIED DEVICES

TECHNICAL FIELD

The present disclosure relates in general to information handling systems, and more particularly to acoustic damping in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems (e.g., storage nodes) may have one or more backplanes for connecting physical storage resources such as hard drives and/or solid-state drives. In various embodiments, one or more air movers (e.g., fans, blowers, etc.) may be used to move air across such physical storage resources for cooling purposes. In some embodiments, air movers may be disposed downstream of the physical storage resources, although in other embodiments they may also be disposed upstream.

Hard drives (which include rotational media) are sensitive to acoustic disturbances that can be caused by air movers, particularly when the air movers are run at high speeds. Accordingly, there may be a benefit to including acoustic damping solutions, which may also be referred to herein as dynamics damping solutions.

However, solid state drives and drive bays without drives installed do not need such dynamics solutions. In fact, including damping solutions in such cases can create additional air flow impedance without providing any real benefit.

In general, there is a tradeoff between the thermal requirements and the dynamics requirements of hard drives. Increasing cooling requirements necessitate more powerful air movers, but I/O throughput performance degrades with increased acoustical and vibrational disturbances from those air movers.

Accordingly, it would be desirable to be able to provide dynamics damping only where it is needed in a system.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with acoustic damping may be reduced or eliminated.

In accordance with embodiments of the present disclosure, an information handling system may include a backplane configured to couple at a first side thereof to a plurality of physical storage resources, an air mover configured to provide cooling to the information handling system, and a shelf coupled to the backplane at a second, opposite side thereof, wherein the shelf is disposed between the first side of the backplane and the air mover. The shelf may include an acoustically absorbent material.

In accordance with these and other embodiments of the present disclosure, a method may include coupling an acoustically absorbent material to a shelf; and coupling the shelf to a second side of a backplane of an information handling system, wherein the backplane is configured to couple at a first side thereof to a plurality of physical storage resources, such that the shelf is disposed between the first side of the backplane and an air mover of the information handling system.

In accordance with these and other embodiments of the present disclosure, an apparatus may include a shelf; and an acoustically absorbent material coupled to the shelf. The shelf may be configured to be coupled to a second side of a backplane of an information handling system, wherein the backplane is configured to couple at a first side thereof to a plurality of physical storage resources, such that the shelf is configured to be disposed between the first side of the backplane and an air mover of the information handling system.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "couple-able" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

Figure 1:
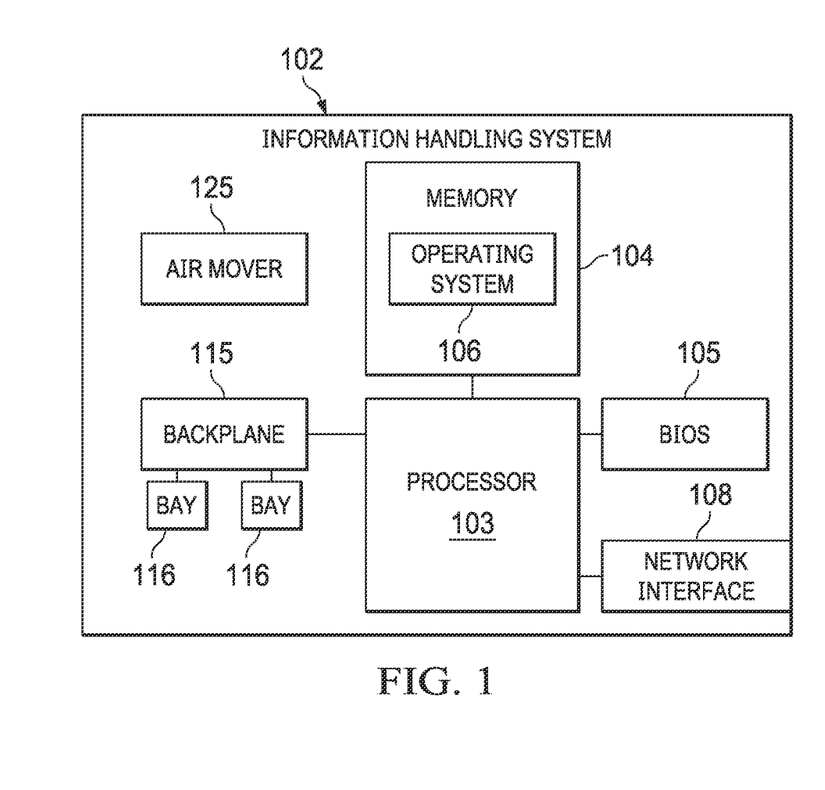
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers and/or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a BIOS 105 (e.g., a UEFI BIOS) communicatively coupled to processor 103, a network interface 108 communicatively coupled to processor 103. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

Information handling system 102 may further include one or more air movers 125 for providing cooling to information handling system 102 and/or components thereof. Air mover 125 may be configured to draw cool air into a chassis of information handling system 102, exhaust hot air from a chassis of information handling system 102, and/or move air within a chassis of information handling system 102. In some embodiments, air mover 125 may be electronically controllable via processor 103 and/or software executing thereon. For example, a speed of air mover 125 may be controllable via a pulse width modulation (PWM) signal.

Information handling system 102 may further include drive bays 116, each configured to receive one or more physical storage resources. Backplane 115 may be used to communicatively couple such physical storage resources to processor 103 of information handling system 102. Although two bays 116 are shown in FIG. 1, any desired number of bays 116 may be used in any particular embodiments.

As discussed in further detail herein, backplane 115 may also have one or more acoustically absorbent elements coupled thereto (e.g., removably coupled thereto) in proximity to physical storage resources such as hard drives. For example, a shelf including acoustically absorbent material may be attached to backplane 115 on the opposite side of backplane 115 from the location of the hard drives, such that the shelf is disposed between the hard drives and an air mover that is configured to cool the hard drives. Thus the shelf and the acoustically absorbent material may reduce the amount of acoustic vibration incident upon the hard drives from the air mover.

Figure 2:
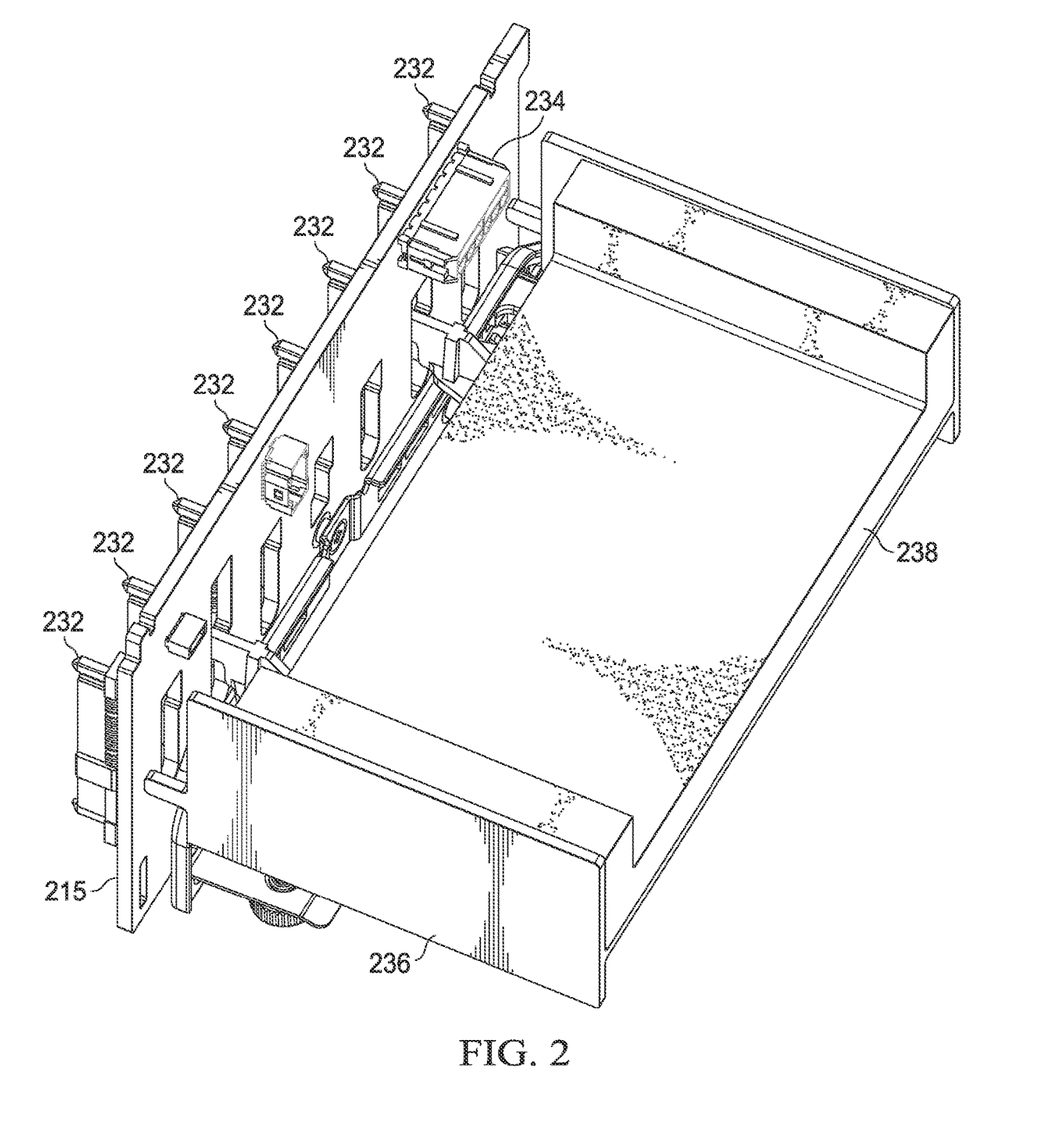
FIG. 2 illustrates a detail view of an example shelf with acoustically absorbent material coupled to a backplane, in accordance with embodiments of the present disclosure.

Turning now to FIG. 2, a detail view of a portion of backplane 215 (which may be generally similar to backplane 115) is shown, according to some embodiments. In this embodiment, backplane 215 is an x8 SAS/SATA (Serial Attached SCSI/Serial ATA) backplane.

Backplane 215 includes a plurality of connectors 232 on a first side thereof for coupling to physical storage resources disposed within a bay (not shown). Backplane 215 may also include a connector 234 on a second side thereof for coupling to a peripheral card such as a RAID (Redundant Array of Independent Disks) card.

Further, backplane 215 may include a shelf 236 for providing acoustic damping. Shelf 236 may be made of any suitable material, such as steel, aluminum, plastic, etc. Shelf 236 may attach directly to backplane 215 and may include an acoustically absorbent material 238 such as foam. In other embodiments, shelf 236 may itself also be made of acoustically absorbent material 238. In some embodiments, acoustically absorbent material 238 may be coupled to shelf 236 via adhesive material, screws, rivets, or any other desired coupling.

Shelf 236 may be offset a desired distance from backplane 215 in order to reduce its impact on airflow impedance in some embodiments. In general, a larger offset distance may allow for greater airflow but may provide less acoustic damping, and so the exact size of the offset may be a tradeoff between these concerns.

In this embodiment, air movers (not shown) may be disposed in an area beyond that of shelf 236 such that they are configured to draw air from the first side of backplane 215 through holes in backplane 215, across shelf 236, and then out an air exhaust of the system. Placing acoustically absorbent material 238 between the hard drives and the air movers may allow acoustically absorbent material 238 to dampen the acoustic energy produced by the air movers before it reaches the hard drives. For purposes of this disclosure, acoustic energy may be considered to have a frequency above 3 kHz. Acoustically absorbent material 238 may also provide some damping for lower-frequency vibrations as well.

Figure 3A:
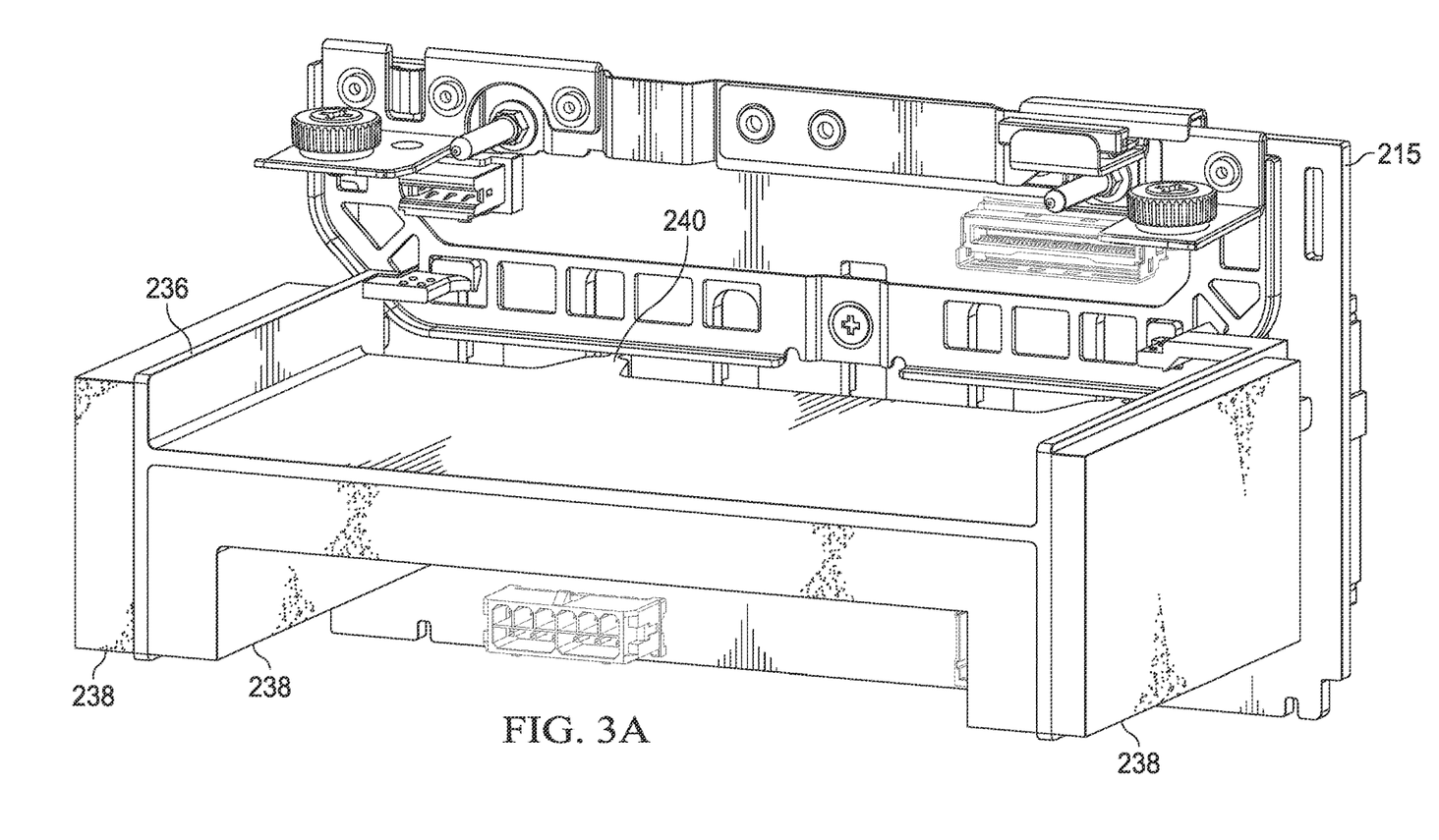
FIGS. 3A-3D illustrate several detail views of example shelves with acoustically absorbent material coupled to a backplane, in accordance with embodiments of the present disclosure.
Figure 3B:
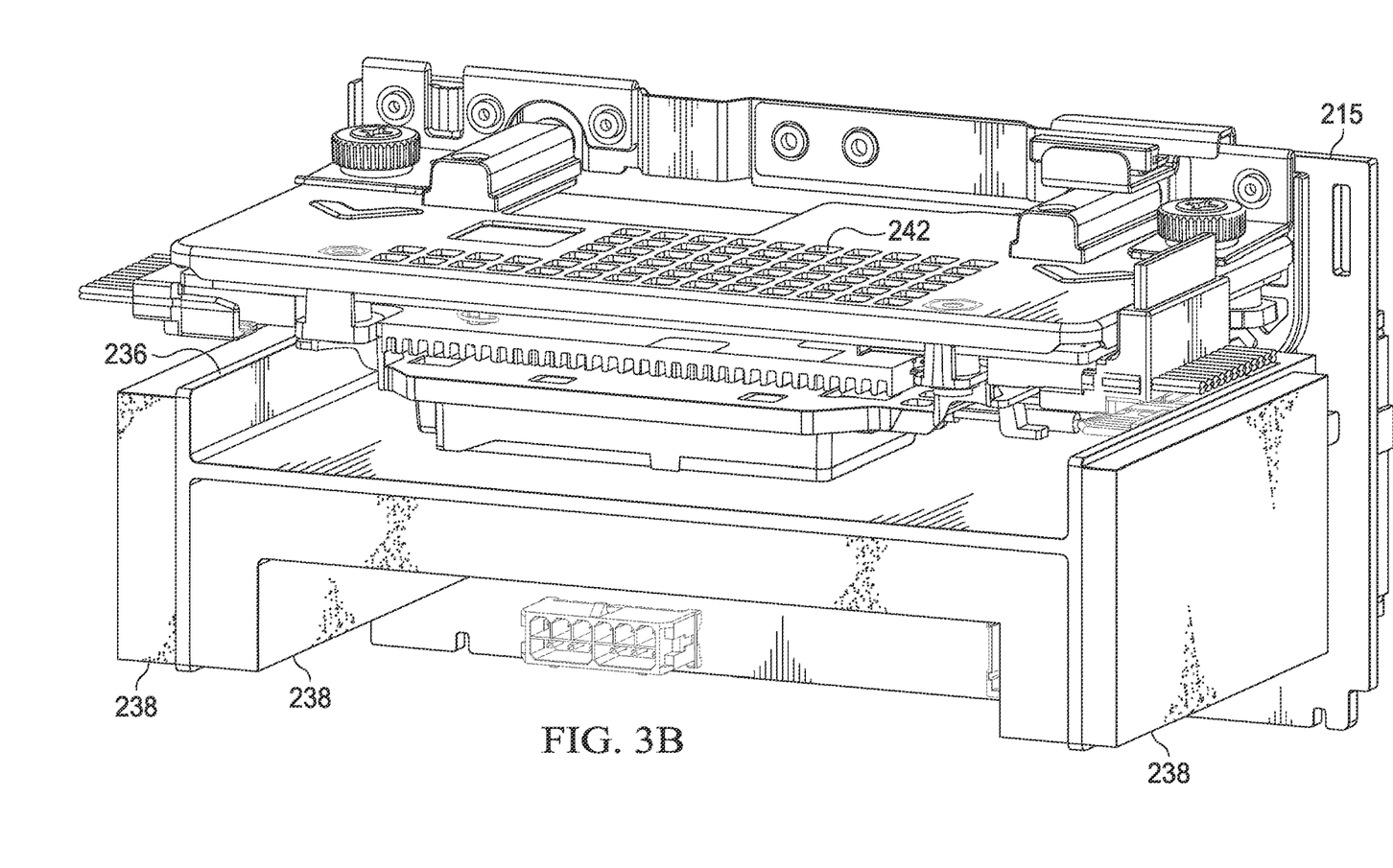

FIG. 3A shows a different view of backplane 215 and shelf 236 from FIG. 2. FIG. 3B shows a similar view, but in which a RAID card 242 is coupled to connector 234. In some embodiments, shelf 236 may be sized and shaped such that it does not interfere with RAID card 242 (or other peripherals that may be coupled to connector 234). Thus shelf 236 may be installed or removed regardless of whether RAID card 242 is installed. As shown in FIG. 3A, shelf 236 may be attached to backplane 215 via one or more snap-in connections 240 (e.g., tabs that may be inserted into corresponding holes of backplane 215). In other embodiments, screws or other fasteners may be used in addition to or in lieu of snap-in connection 240.

Figure 3C:
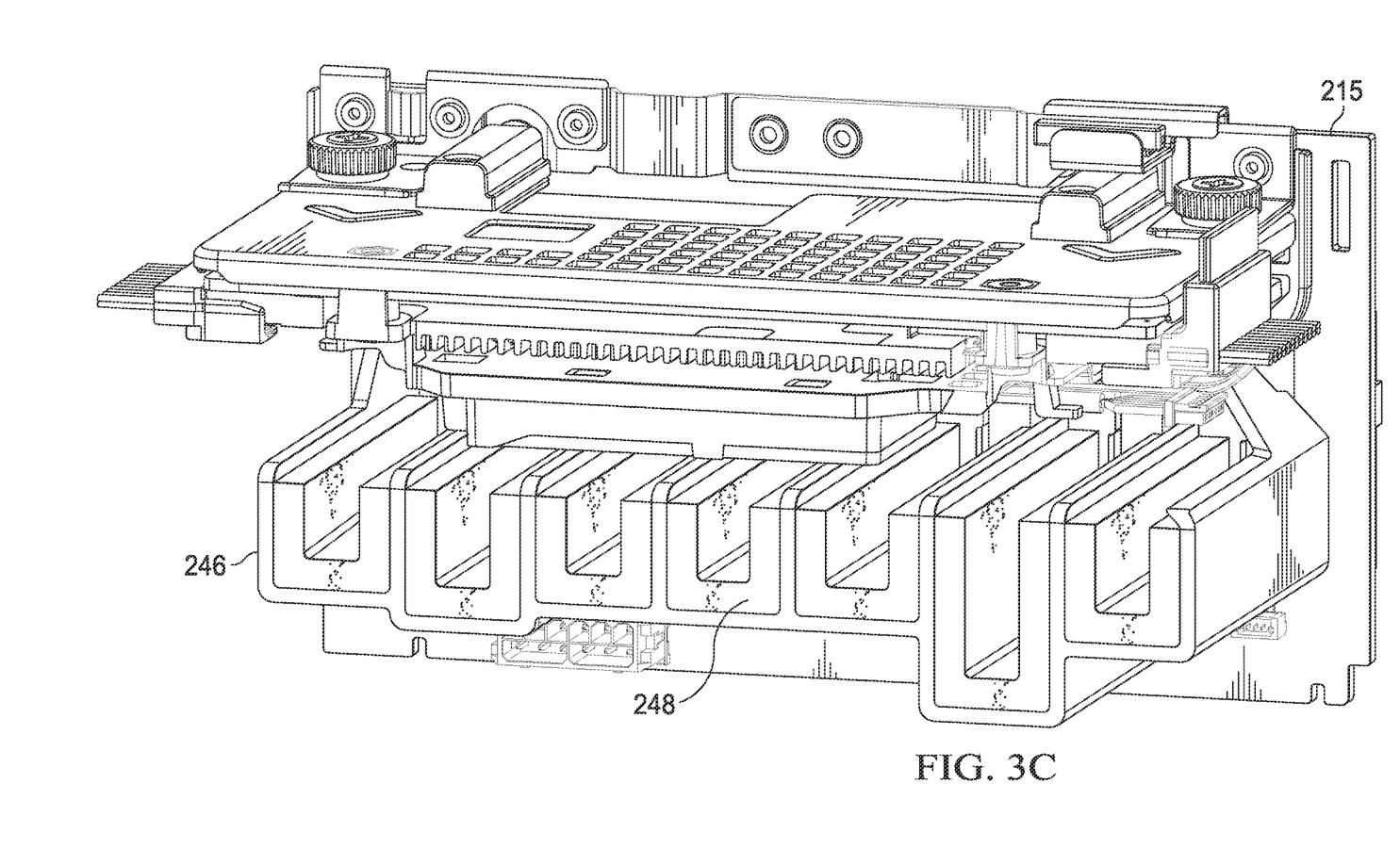
Figure 3D:
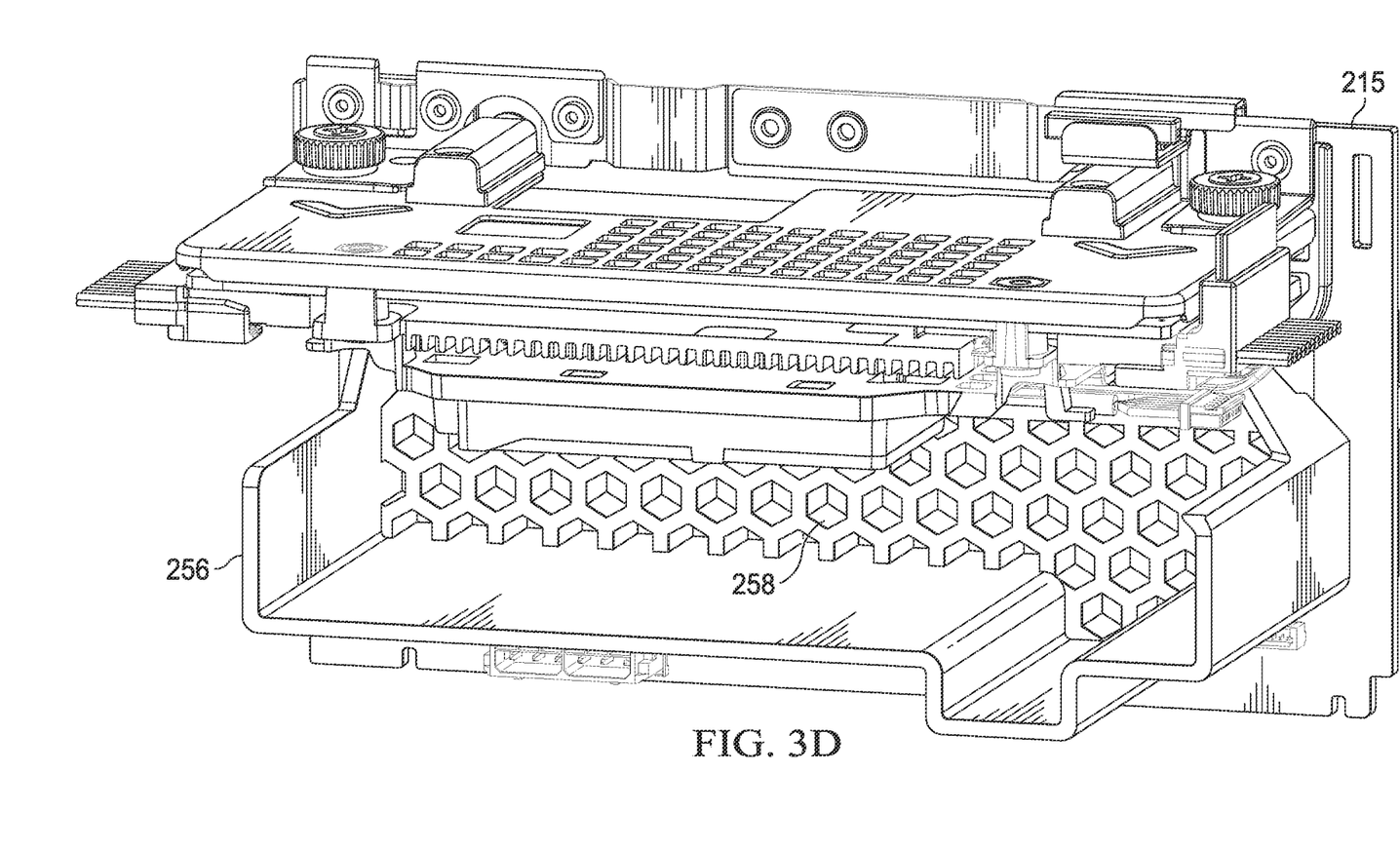

FIGS. 3C and 3D show additional embodiments of shelves that may be attached to backplane 215. In FIG. 3C, shelf 246 with acoustically absorbent material 248 is shown. Shelf 246 includes vertical ribs, which may allow for an increased footprint of acoustically absorbent material 248 within a given amount of space, as well as reducing the blocking of airflow openings in backplane 215.

In FIG. 3D, shelf 256 with acoustically absorbent material 258 includes a honeycomb pattern, which may smooth the airflow and reduce turbulence.

One of ordinary skill in the art with the benefit of this disclosure will readily appreciate that other arrangements of shelf material and acoustically absorbent material may also provide benefits.

The various shelves according to this disclosure may in some embodiments be attached only in positions corresponding to bays with hard drives therein. If a bay includes solid state drives or is empty, then a shelf may be omitted in that position to prevent any airflow disruption. For example, a particular backplane may have a plurality of bays for physical storage resources, and those bays need not be configured identically. Shelves may have a size corresponding to a single bay (e.g., a bay of eight physical storage resources), and so they may be installed in positions corresponding to bays that are populated with hard drives, but not in positions corresponding to bays that are populated with solid state drives or are empty.

Figure 4:
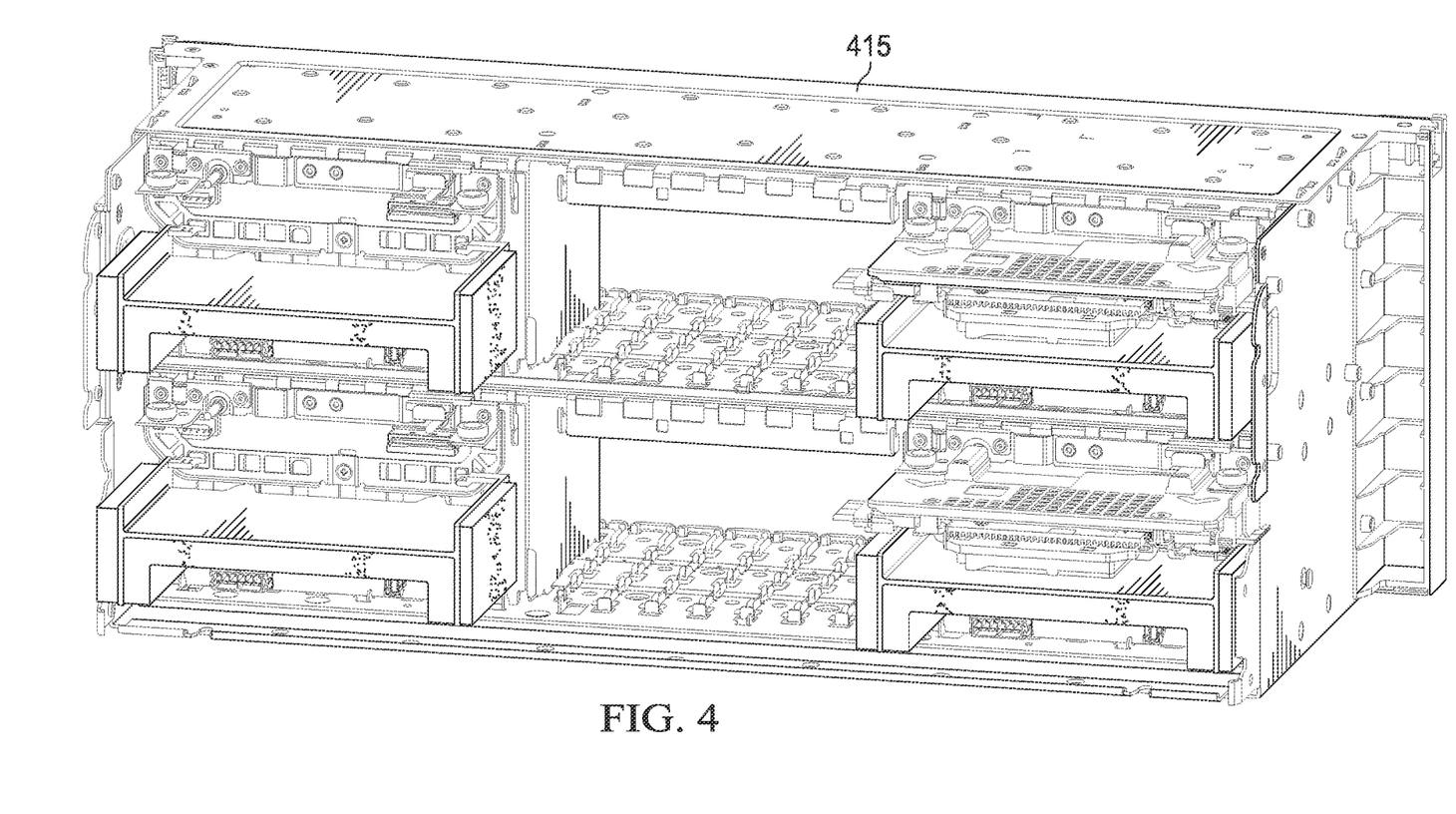
FIG. 4 illustrates multiple example shelves with acoustically absorbent material coupled to a single backplane, in accordance with embodiments of the present disclosure.

FIG. 4 illustrates backplane 415 according to such an embodiment. Backplane 415 includes six different bays, four of which are populated with hard drives. The four populated bays include shelves with acoustically absorbent material, and the two empty bays do not.

Accordingly, various embodiments of this disclosure may provide many advantages. For example, it may be possible in some embodiments to run air movers at 100% of full air mover speed (e.g., 100% PWM) without negatively impacting the I/O rates of hard drives. Although embodiments may increase airflow impedance somewhat, the ability to run air movers at 100% typically more than offsets this increased impedance, leading to overall lower system temperatures.

Although various possible advantages with respect to embodiments of this disclosure have been described, one of ordinary skill in the art with the benefit of this disclosure will understand that in any particular embodiment, not all of such advantages may be applicable. In any particular embodiment, some, all, or even none of the listed advantages may apply.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Unless otherwise specifically noted, articles depicted in the drawings are not necessarily drawn to scale. However, in some embodiments, articles depicted in the drawings may be to scale.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
    a backplane configured to couple at a first side thereof to a plurality of physical storage resources, wherein the backplane includes a plurality of drive bays each configured to receive one or more of the plurality of physical storage resources, wherein a first drive bay includes hard drives received therein and a second drive bay includes solid state drives received therein;
    an air mover configured to provide cooling to the information handling system; and
    a shelf removably coupled to the backplane at a second, opposite side thereof, wherein the shelf is coupled to the backplane at a position corresponding to the first drive bay and no shelf is coupled to the backplane at a position corresponding to the second drive bay, wherein the shelf is disposed between the first side of the backplane and the air mover, and wherein the shelf includes an acoustically absorbent material formed into a honeycomb pattern.

2. The information handling system of claim 1, wherein the acoustically absorbent material comprises foam.

3. A method comprising:
    removably coupling an acoustically absorbent material to a shelf, wherein the acoustically absorbent material is formed into a honeycomb pattern; and
    coupling the shelf to a second side of a backplane of an information handling system, wherein the backplane is configured to couple at a first side thereof to a plurality of physical storage resources, such that the shelf is disposed between the first side of the backplane and an air mover of the information handling system;
    wherein the backplane includes a plurality of drive bays each configured to receive one or more of the plurality of physical storage resources, wherein a first drive bay includes hard drives received therein and a second drive bay includes solid state drives received therein, and wherein the shelf is coupled to the backplane at a position corresponding to the first drive bay and no shelf is coupled to the backplane at a position corresponding to the second drive bay.

4. The method of claim 3, wherein the acoustically absorbent material is coupled to the shelf via an adhesive.

5. The method of claim 3, wherein the acoustically absorbent material comprises foam.

6. The method of claim 3, wherein coupling the shelf to the second side of the backplane includes inserting a tab of the shelf into a hole of the backplane.

7. An apparatus comprising:
    a shelf; and
    an acoustically absorbent material coupled to the shelf, wherein the acoustically absorbent material is formed into a honeycomb pattern;
    wherein the shelf is configured to be removably coupled to a second side of a backplane of an information handling system, wherein the backplane is configured to couple at a first side thereof to a plurality of physical storage resources, such that the shelf is configured to be disposed between the first side of the backplane and an air mover of the information handling system;
    wherein the backplane includes a plurality of drive bays each configured to receive one or more of the plurality of physical storage resources, wherein a first drive bay includes hard drives received therein and a second drive bay includes solid state drives received therein, and wherein the shelf is coupled to the backplane at a position corresponding to the first drive bay and no shelf is coupled to the backplane at a position corresponding to the second drive bay.

8. The apparatus of claim 7, wherein the acoustically absorbent material comprises foam.

9. The apparatus of claim 7, wherein a different one of the plurality of drive bays does not include physical storage resources received therein, and wherein no shelf is coupled to the backplane at a position corresponding to the different one of the plurality of drive bays.

* * * * *